US011276672B1

(12) United States Patent
Wu et al.

(10) Patent No.: US 11,276,672 B1
(45) Date of Patent: Mar. 15, 2022

(54) BONDING DUMMY ELECTRODES OF LIGHT EMITTING DIODE CHIP TO SUBSTRATE

(71) Applicant: Facebook Technologies, LLC, Menlo Park, CA (US)

(72) Inventors: Jeb Wu, Redmond, WA (US); Oscar Torrents Abad, Cork (IE); Daniel Brodoceanu, Cork (IE); Pooya Saketi, Cork (IE); Zheng Sung Chio, Cork (IE); Ali Sengül, Zurich (CH)

(73) Assignee: Facebook Technologies, LLC, Menlo Park, CA (US)

( * ) Notice: Subject to any disclaimer, the term of this patent is extended or adjusted under 35 U.S.C. 154(b) by 166 days.

(21) Appl. No.: 16/596,527

(22) Filed: Oct. 8, 2019

Related U.S. Application Data

(60) Provisional application No. 62/839,364, filed on Apr. 26, 2019.

(51) Int. Cl.
*H01L 25/075* (2006.01)
*H01L 33/62* (2010.01)
*H01L 21/66* (2006.01)

(52) U.S. Cl.
CPC .......... *H01L 25/0753* (2013.01); *H01L 22/14* (2013.01); *H01L 33/62* (2013.01); *H01L 2933/0066* (2013.01)

(58) Field of Classification Search
CPC ......... H01L 22/14; H01L 22/30; H01L 22/32; H01L 25/0753; H01L 33/62; H01L 2933/0066; H01L 2224/81007; H01L 2224/81; H01L 2224/83007; H01L 2224/83; H01L 2224/8112–81141
See application file for complete search history.

(56) References Cited

U.S. PATENT DOCUMENTS

| | | | |
|---|---|---|---|
| 10,535,572 B2 * | 1/2020 | Liao | H01L 22/34 |
| 10,998,286 B1 * | 5/2021 | Brodoceanu | H01L 33/30 |
| 2017/0069588 A1 * | 3/2017 | Monma | H01L 21/56 |
| 2020/0091386 A1 * | 3/2020 | Torrents Abad | H01L 24/14 |
| 2020/0152827 A1 * | 5/2020 | Chen | H01L 25/0753 |
| 2020/0203235 A1 * | 6/2020 | Jung | H01L 25/167 |
| 2020/0259055 A1 * | 8/2020 | Iguchi | H01L 33/62 |

* cited by examiner

*Primary Examiner* — Michael M Trinh
(74) *Attorney, Agent, or Firm* — Fenwick & West LLP

(57) ABSTRACT

A light emitting diode (LED) chip is bonded to a substrate. The LED chip includes one or more dummy electrodes that corresponds to one or more contacts on the substrate. The one or more dummy electrodes are exposed to a laser beam for coupling the one or more dummy electrodes to the one or more contacts. The one or more dummy electrodes may be positioned along edges of the LED chip that surround a display area of the LED chip and provide bonding strength between the LED chip and the substrate.

10 Claims, 5 Drawing Sheets

BONDING DUMMY ELECTRODES OF LIGHT EMITTING DIODE CHIP TO SUBSTRATE

CROSS REFERENCE TO RELATED APPLICATION

This application claims the benefit of U.S. Provisional Application No. 62/839,364, filed Apr. 26, 2019, which is incorporated by reference in its entirety.

BACKGROUND

This disclosure relates generally to bonding a light emitting diode (LED) to a substrate using a laser.

Displays are ubiquitous and are a core component of many wearable electronic devices, smart phones, tablets, laptops, desktops, TVs and display systems. Some example display technologies include Inorganic Light Emitting Diode (ILED) displays and Organic Light Emitting Diode (OLED) displays. Displays can be manufactured by placing LEDs (e.g., red, green, and blue OLEDs) at each pixel using standard manufacturing techniques, such as a pick and place process. However, certain aspects of a conventional pick and place process may be unsuitable for some applications, such as manufacturing smaller displays for use in devices like smartphones or virtual reality headsets.

During manufacturing of a display device, an LED chip may be attached to a substrate by bonding electrodes of the LED chip to contacts on a substrate using thermal compression (TC) bonding or other processes such as laser bonding. However, during the process of attaching the LED chip to the substrate, the LED chip may become misaligned with the substrate. This can lead to additional steps during manufacturing to reattach the LED chip, which increases cost and manufacturing time for the display device. Furthermore, if during the process of attaching the LED chip to the substrate, the LED chip becomes misaligned with the substrate, the LED chip may be discarded. This reduces yield of the manufacturing process.

SUMMARY

Embodiments relate to bonding dummy electrodes of an LED chip to contacts of a substrate using a laser. Laser beams are applied to the dummy electrodes or the corresponding contacts to attach the LED chip to the substrate. The dummy electrodes are not electrically connected to circuit components of the LED chip and do not receive signal for driving LEDs on the LED chip. The dummy electrodes may provide physical bonding between the LED chip and the substrate while the LEDs on the LED chip are tested for operability prior to permanently securing the LEDs onto the substrate and while the LEDs are secured to the substrate.

The figures depict various embodiments for purposes of illustration only. One skilled in the art will readily recognize from the following discussion that alternative embodiments of the structures and methods illustrated herein may be employed without departing from the principles described herein.

DETAILED DESCRIPTION

Embodiments relate to a method of bonding an LED chip onto a substrate by applying a laser beam to dummy electrodes located around edges of the LED chip. The dummy electrodes provide additional contact between the LED chip and the substrate to improve attachment between the LED chip and the substrate.

Figure 1A:
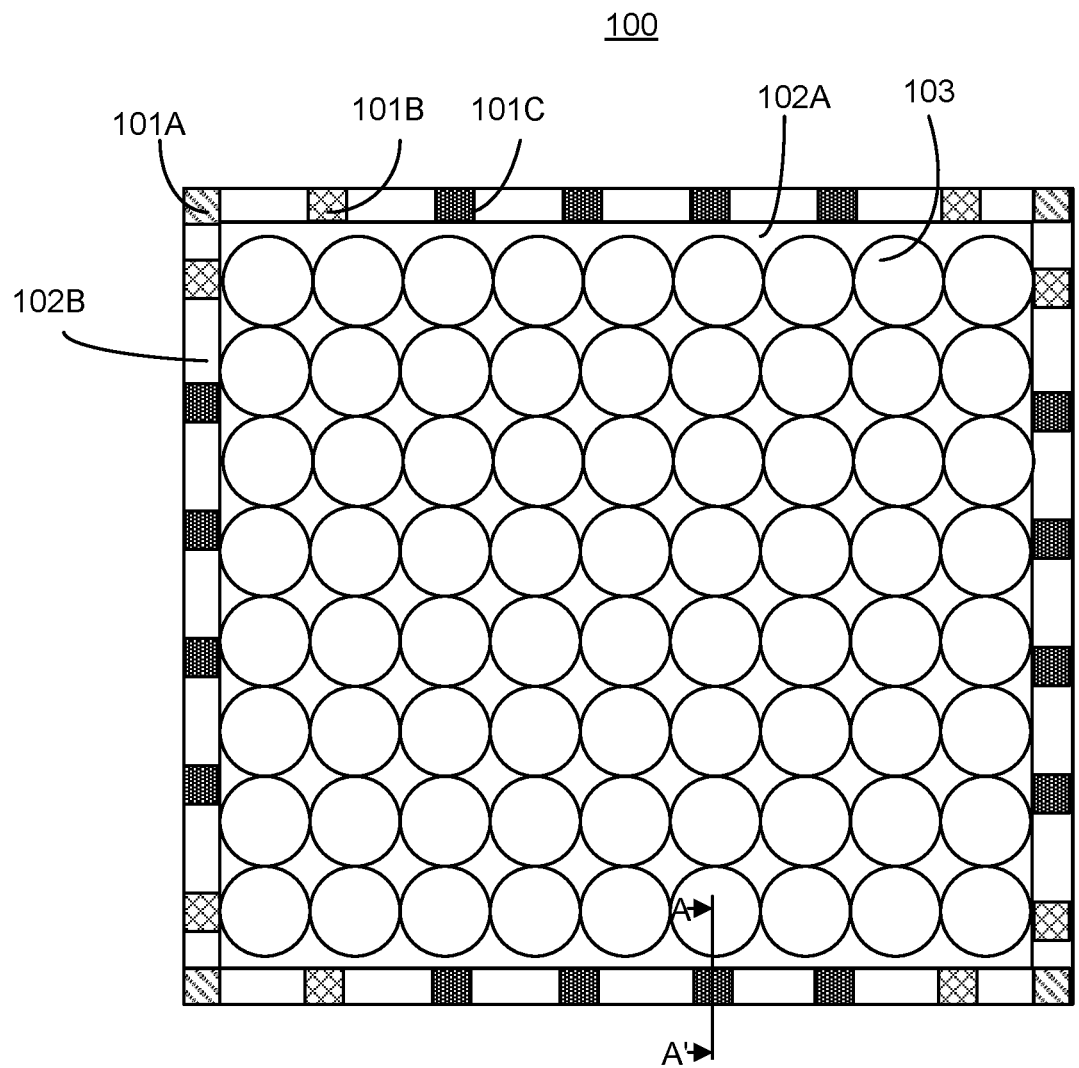
FIG. 1A is a plan view of an LED chip, in accordance with an embodiment.

FIG. 1A is a plan view of an LED chip 100, in accordance with an embodiment. The LED chip 100 has a display area 102A and an edge area 102B surrounding the display area 102A. The display area 102A includes, among others, an array of LEDs 103. The array of LEDs 103 may be arranged into rows and columns, and each LED 103 has a light emission area from which light is emitted.

In some embodiments, the LEDs 103 may be microLEDs. In some embodiments, the feature size of the microLEDs (e.g., the diameter) may be below 50 The LEDs 103 may be one of many microLEDs of an array on the LED chip 100, with the pitch (e.g., spacing between microLEDs) ranging from sub-micrometers to tens of micrometers. In other embodiments, the LEDs 103 may be miniLEDs with diameters ranging between 50 µm to 200 µm or monolithic LEDs. In one embodiment, all of the LEDs 103 on the LED chip 100 correspond to a same color and emit light of the same color in the display area 102A. In another embodiment, the LEDs 103 in the LED chip 100 vary in color. For example, LEDs 103 in a first row in the display area 102A correspond to a first color (e.g., red), LEDs 103 in a second row correspond to a second color (e.g., green) different from the first color, and LEDs 103 in a third row correspond to a third color (e.g., blue) different from the first and the second colors.

The edge area 102B has testing electrodes 101A, common electrodes 101B, and dummy electrodes 101C in a periphery of the LED chip 100. The testing electrodes 101A, the common electrodes 101B, and the dummy electrodes 101C may be made of conductive material such as copper, copper alloys, aluminum, aluminum alloys, gold and silver. The testing electrodes 101A may be disposed at corners of the LED chip 100 and provide testing signals to the plurality of LEDs 103 in the LED chip 100 to test whether the plurality of LEDs 103 are operable. When a testing electrode 101A is applied with a testing voltage that exceeds a threshold voltage, at least one LED 103 on the LED chip 100 connected to the testing electrode 101A is expected to turn on. If one or more of the at least one LED 103 connected to the testing electrode 101A does not emit light responsive to the testing voltage being applied, the one or more of the at least one LED 103 may be identified as defective. Each of the different testing electrodes 101A may be connected to a different set of LEDs 103. The testing electrodes 101A can also be used to detect current leakage in the LED chip 100. When an LED 103 associated with a first testing electrode 101A emits light while a second testing electrode 101A is applied with a testing voltage and no voltage is applied to the first testing electrode 101A, it indicates that there may be current leakage causing the LED 103 to turn on even though the LED 103 should not be receiving any current.

The common electrodes 101B may also be disposed in the edge area 102B. Depending on the type of the LEDs 103 used in the LED chip 100, the common electrodes 101B may be common cathodes or common anodes. In one embodiment, each LED 103 includes a p-electrode and an n-electrode. In other embodiments, each LED may have either of an individual p-electrode but share an n-electrode with other LEDs on the LED chip 100 or have an individual n-electrode but share a p-electrode with other LEDs. The common electrodes 101B are used as common ground (or common voltage source) that power the LEDs 103. Each common electrode 101B is electrically connected to at least one LED 103 in the display area 102A.

The dummy electrodes 101C are used for securing the LED chip 100 onto a substrate 120. The dummy electrodes 101C are not electrically connected to any components on the LED chip 100 and do not carry any signals or current to the LEDs 103. The dummy electrodes 101C are additional contact points at which the LED chip 100 is coupled to a substrate 120 for a stronger attachment between the LED chip 100 and the substrate 120 to improve structural stability. The dummy electrodes 101C may be formed in the same manufacturing step as the testing electrodes 101A and the common electrodes 101B. In some embodiments, the dummy electrodes 101C may be square in shape with a length of an edge ranging from sub-micrometers to tens of micrometers (e.g., from 0.1 µm to 50 µm). Each edge of the LED chip in the edge area 102B may include at least one dummy electrode 101C. For even contact between the LED chip and the substrate 120 across the entire LED chip, a number of dummy electrodes 101C and positions of the dummy electrodes 101C on the different edges of the LED chip may be the same.

In some embodiments, the dummy electrodes 101C may be located along die streets of a wafer from which the LED chip 100 is manufactured. When the wafer is diced, the dummy electrodes 101C are removed from the LED chip 100 which reduces a total size of the LED chip 100 for producing more compact display devices. The wafer may be diced in final stages of manufacturing after bonding the active electrodes 115 of the LEDs 103. Additionally, removing the dummy electrodes 101C may reduce thermal-mechanical stress of the LED chip 100. In other embodiments, the dummy electrodes 101C may not be removed from the LED chip 100 and used to improve bonding between the LED chip 100 and the substrate 120.

The locations and the numbers of the testing electrodes 101A, the common electrodes 101B, and the dummy electrodes 101C may be varied. For example, the common electrodes 101B and the dummy electrodes 101C may be disposed in the display area 102A instead of the edge area 102B and there may be additional testing electrodes 101A. Also, although FIG. 1A illustrate testing electrodes 101A provided at the corners of the LED chip 100, dummy electrodes 101C or common electrodes 101B may be placed at the corners or even in the display area 102A of the LED chip 100 instead. When the dummy electrodes 101C or common electrodes 101B are provided in the display area 102A, these electrodes may replace one or more of the LEDs 103. Further, although the testing electrodes 101A, the common electrodes 101B and the dummy electrodes 101C are illustrated in FIG. 1A as having the same size, these electrodes may have different sizes. For example, the dummy electrodes 101C may have a size larger than the common electrodes 101B or the testing electrodes 101A.

Figure 1B:
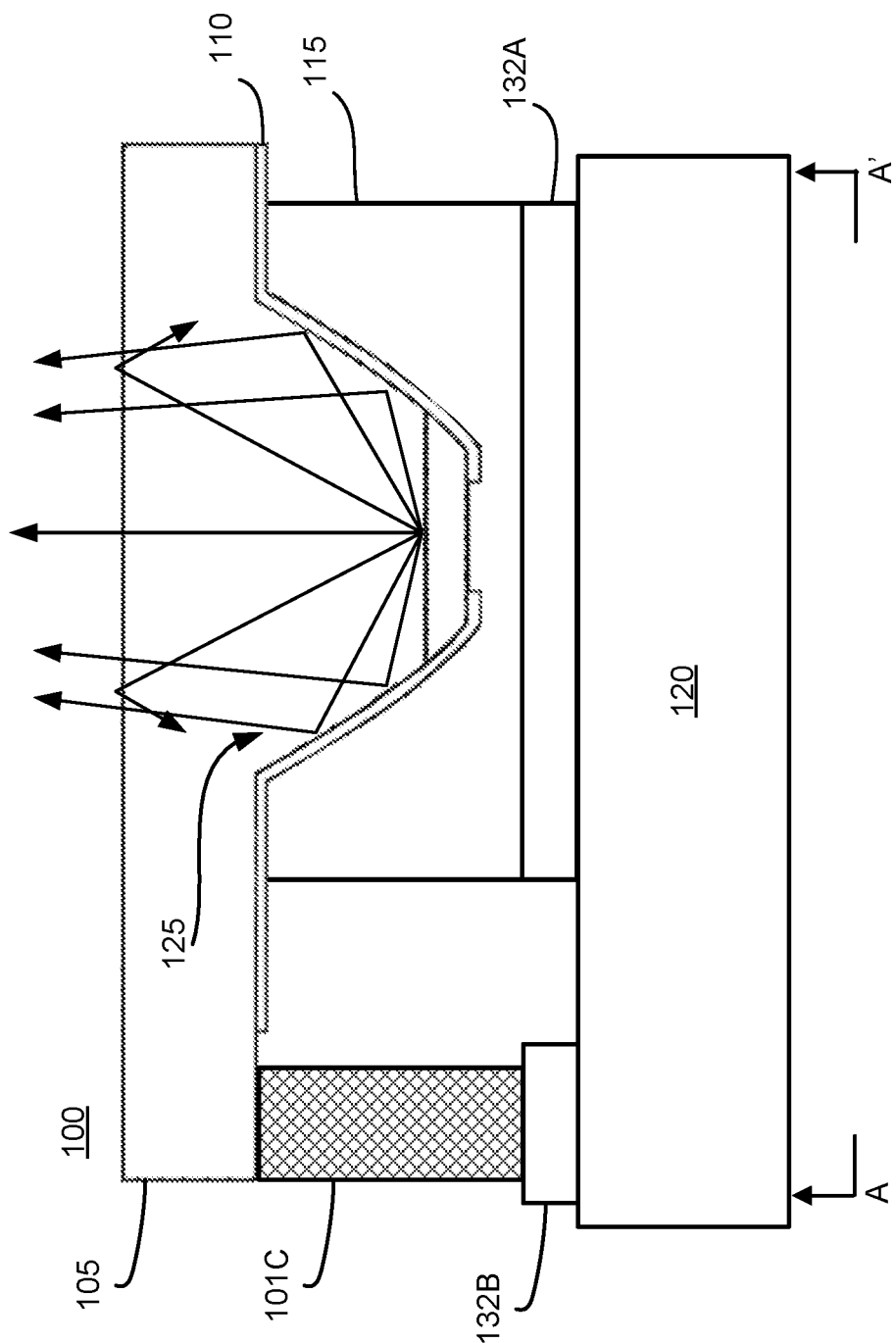
FIG. 1B is a cross sectional diagram illustrating the LED chip of FIG. 1A mounted on a substrate, in accordance with an embodiment.

FIG. 1B is a cross sectional diagram illustrating the LED chip 100 of FIG. 1A mounted on a substrate 120, in accordance with an embodiment. FIG. 1B illustrates a cross section of a portion of the display area 102A and the edge area 102B including the dummy electrode 101C. The portion of the display area 102A shown in FIG. 1B includes one LED 103 of the LED chip 100. The LED chip 100 may include, among other components, a semiconductor layer 105 grown on the substrate, a dielectric layer 110 in contact with a portion of the semiconductor layer 105, an active electrode 115 coupled to a first contact 132A of the substrate 120, and the dummy electrode 101C coupled to a second contact 132B of the substrate 120.

Although the dummy electrode 101C may be bonded to the second contact 132B of the substrate 120 that may be a part of an integrated circuit, the second contact 132B may not be connected to conductive lines that deliver signals. The dummy electrode 101C may be in contact with a portion of the semiconductor layer 105 or in contact with a different portion of the LED chip 100.

In some embodiments, the semiconductor layer 105 is a gallium semiconductor layer formed of a semiconductor material such as gallium nitride (GaN), indium gallium nitride (InGaN), gallium phosphide (GaP), gallium arsenide phosphide (GaAsP), alluminum indium gallium phosphate (AlInGaP), or gallium arsenide (GaAs). The type of material used depends on the color of the LEDs 103. In one example, the n-type portion of the semiconductor layer 105 is in contact with the common electrode 101B (e.g., n-electrode), and the p-type portion of the semiconductor layer 105 is in contact with the individual active electrode 115 (e.g., p-electrode). In another example, the p-type portion of the semiconductor layer 105 is in contact with the common electrode 101B (e.g., p-electrode), and the n-type portion of the semiconductor layer 105 is in contact with the active electrode 115 (e.g., n-electrode). The substrate 120 may be a part of an integrated circuit or include an integrated circuit and/or conductive lines that are connected to the first contact 132A and other contacts 132 to provide signals to the common electrode 101B and the active electrode 115 for operating the LED 103.

In some embodiments, the semiconductor layer 105 has an emission area 125 that is shaped like into a mesa. The mesa has a truncated top, on a side opposing the light emitting surface of the semiconductor layer 105. The mesa also has a near-parabolic shape to form a reflective enclosure for light generated within the emission area 125. The parabolic shape of the mesa results in the reflected light being collimated, and improves extraction efficiency by directing the light to be incident at the light emitting surface within a critical angle of the light emitting surface. When seen from a plan view, the active electrode 115 may have a square shape, and the emission area 125 may have a circular shape such that a diagonal dimension of the active electrode 115 is greater than a diameter of the emission area 125. Because the diagonal dimension of the active electrode 115 is greater, the corners of the active electrode 115 lie outside of the emission area 125. In addition to the corners, edges of the active electrode 115 may lie outside of the emission area 125. The active electrode 115 may be bonded to the first contact 132A at the corners of the active electrode 115 to avoid applying heat to the emission area 125 during manufacturing process. The active electrode 115 may also be bonded to the first contact 132A at other positions along the edges of the active electrode 115 outside of the emission area 125.

In some embodiments, the common electrode 101B connected to one side of the semiconductor layer 105 is connected to a contact 132 on the substrate 120 and the active electrode 115 connected to another side of the semiconductor layer 105 is connected to the first contact 132A. To cause the LED 103 to emit light from the emission area 125, a voltage difference of at least a threshold voltage of the LED 103 is applied to the common electrode 101B and the active electrode 115 via the substrate 120. The contacts 132 on the substrate 120 are connected to voltage and/or current sources via conductive traces on the substrate 120 and provides signals to the LED 103.

In some embodiments, the dielectric layer 110 prevents portions of the semiconductor layer 105 from being electrically connected to the active electrode 115. The dielectric layer 110 lies between the portions of the semiconductor layer 105 and the active electrode 115 and prevents direct contact between the portions of the semiconductor layer 105 and the active electrode 115. For example, in the example shown in FIG. 1B, the dielectric layer 110 prevents current from flowing to the semiconductor layer 105 in the curved sides and a portion of the flat region of the emission area 125.

Although only a single emission area 125 is shown in FIG. 1B, additional emission areas 125 are included in the display area 102A. Each of the LEDs 103 in the display area 102A corresponds to an emission area 125 from which light is emitted.

Figure 2:
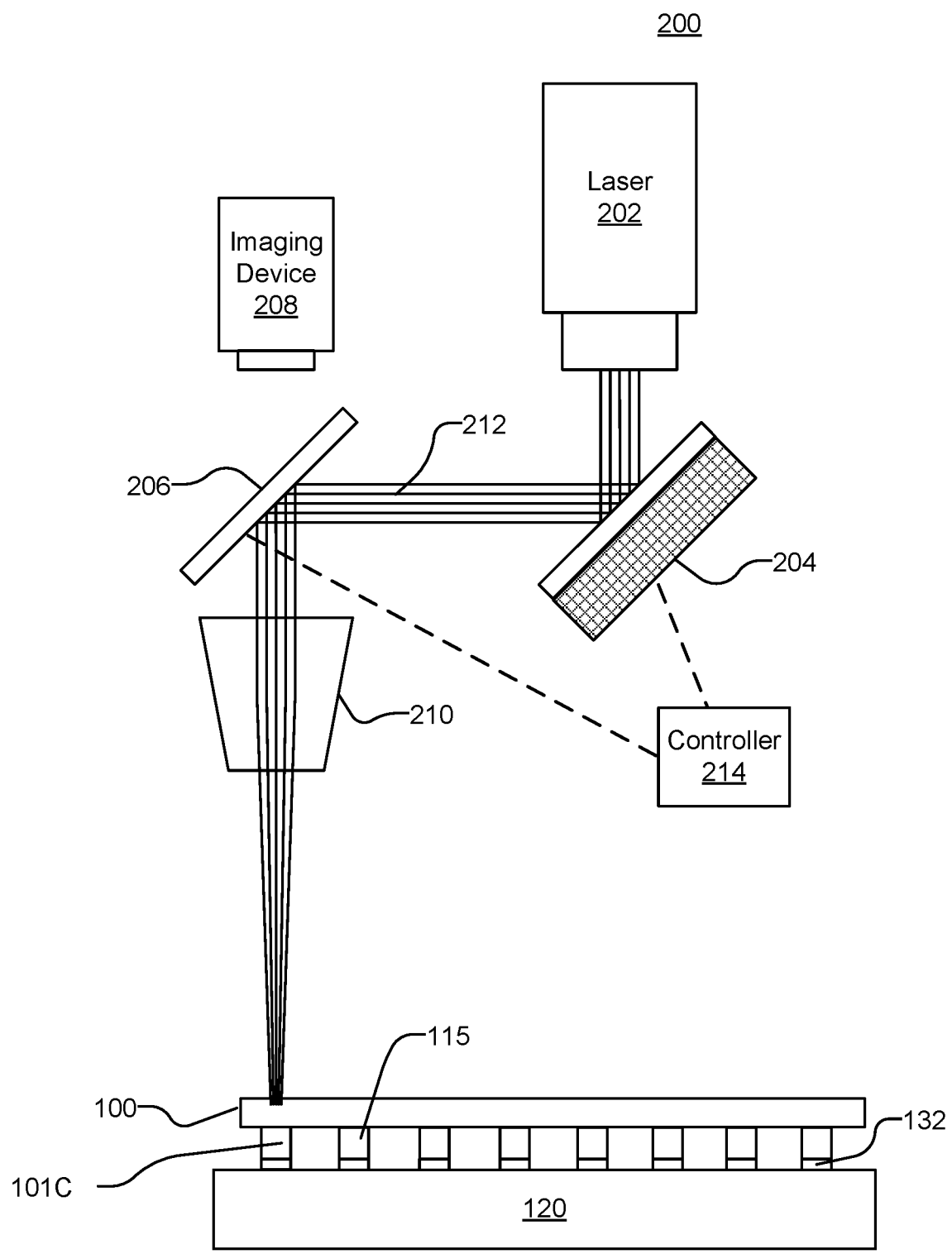
FIG. 2 is a diagram illustrating a system for bonding the LED chip onto the substrate using a laser, in accordance with an embodiment.

FIG. 2 is a diagram illustrating a system 200 for bonding the LED chip 100 onto the substrate 120 using a laser 202, in accordance with an embodiment. The system 200 may include, among other components, a laser 202, an actuated mirror 204, a dichroic mirror 206, an imaging device 208, and a microscope objective 210. The components in the system 200 and the positions of the components for bonding LED chip 100 to the substrate 120 may be varied.

To couple the electrodes on the LED chip 100 (i.e., testing electrodes 101A, common electrodes 101B, dummy electrodes 101C, active electrodes 115) to the contacts 132 of the substrate 120, the laser 202 emits a laser beam 212 that heats the material forming the electrodes and/or the contacts 132. In some embodiments, the heat causes reflow of metals in the electrodes and the contacts 132 and bonds the electrodes to the contacts 132. In other embodiments, heat is applied to the electrodes and/or the contacts 132 until a metal bond is formed at an interface between the electrodes and the corresponding contacts 132. The trajectory of the laser beam 212 is controlled by the actuated mirror 204 and the dichroic mirror 206. First, the laser beam 212 emitted by the laser 202 is directed toward the actuated mirror 204. The actuated mirror 204 has a reflective surface for reflecting the incident laser beam 212 towards the dichroic mirror 206. The actuator mirror 204 is controlled by the controller 214 that provides signals to adjust a position of the actuator mirror 204 such that the laser beam 212 is correctly directed to the dichroic mirror 206.

The dichroic mirror 206 reflects light within a first range of wavelengths and transmits light in a second range of wavelengths different from the first range. In the example shown in FIG. 2, the dichroic mirror 206 is positioned between the laser 202 and the LED chip 100 and positioned between the microscope objective 210 and the imaging device 208. The dichroic mirror 206 reflects the laser beam 212 emitted by the laser 202 towards the LED chip 100 but transmits light used by the imaging device 208 for capturing images. The first range of wavelengths may include a wavelength of the laser beam 212, and the second range of wavelengths may include the visible light spectrum used by the imaging device 208 to capture images. Light reflected from the LED chip 100 passes through the microscope objective 210 and enters the imaging device 208.

The imaging device 208 captures images of the LED chip 100 using light reflected by the LED chip 100. The imaging device 208 may be connected to a processor and/or one or more application-specific circuits that are dedicated to capturing images and processing the captured images. The imaging device 208 is used to align the laser beam 212 to a desired position on the LED chip 100 for accurately bonding the electrodes on the LED chip 100 onto the substrate 120. Although not shown in FIG. 2, the imaging device 208 may be connected to the controller 214 that controls the actuator mirror 204 and the dichroic mirror 206 for directing laser beam to the LED chip 100. The imaging device 208 may also be connected to a stand-alone unit separate from the controller 214 that can communicate with the controller 214 for orienting the adjustable components in the system 200.

In some embodiments, the system 200 is in a fixed position such that the laser beam 212 remains directed to a fixed location, and a stage that the LED chip 100 and substrate 120 are on is moved to align the fixed position with a position on the LED chip 100 to be bonded. In other embodiments, the system 200 shifts while the LED chip 100 and the substrate 120 remain stationary during the manufacturing process.

To avoid wasting resources and time, the LEDs 103 on the LED chip 100 may be tested for operability prior to permanently securing the LED chip 100 to the substrate 120. The LED chip 100 may be positioned such that the active electrodes 115, the testing electrodes 101A, the common electrodes 101B, and the dummy electrodes 101C are aligned with corresponding contacts 132 on the substrate 120. Once the LED chip 100 is properly aligned, the dummy electrodes 101C in the edge area 102B may be bonded to the substrate 120 by exposing the subset to the laser beam 212 to temporarily fix the LED chip 100 to the substrate 120. Fixing the dummy electrodes 101C to the substrate 120 helps to avoid misalignment of the LED chip 100 relative to the substrate 120 when bonding the rest of the LED chip 100 to the substrate 120.

To bond the dummy electrodes 101C to the contacts 132 on the substrate 120, the laser 202 may scan along edges of the LED chip 100 in the edge area 102B (e.g., in a clockwise/counterclockwise direction) and direct the laser beam 212 onto the dummy electrodes 101C. In some embodiments, the laser 202 may skip the testing electrodes 101A and the common electrodes 101B that are also disposed in the edge area 102B and bond just the dummy electrodes 101C prior to testing the LEDs 103 and bonding the active electrodes 115. The laser beam 212 may include multiple beams that are spaced apart by a predetermined with to bond more than one dummy electrodes 101C at once to improve efficiency. Using images captured by the imaging device 208, the controller 214 may determine identify positions of the dummy electrodes 101C on the LED chip 100 and provide instructions to the actuated mirror 204 and the dichroic mirror 206 to direct the laser beam 212 onto the dummy electrodes 101C. In other embodiments, the laser 202 may bond the testing electrodes 101A and the common electrodes 101B along with the dummy electrodes 101C prior to testing the LEDs 103 and bonding the active electrodes 115.

After bonding the dummy electrodes 101C to the substrate, to test the operability of the LEDs 103 on the LED chip 100, test voltages may be sequentially applied to testing electrodes 101A along the edges of the LED chip 100. An optical device (e.g., imaging device 208) is used to capture images of the LED chip 100 to determine which LEDs 103 are operationally responsive to applying the test voltages. The optical device may be connected to a controller that determines whether LEDs properly emit light or emit light above a threshold brightness. If not, the LEDs 103 are identified as defective. The defective LEDs 103 may be replaced with new LEDs 103 and the LED chip 100 may be tested again.

Based on the testing, the controller may determine whether to proceed with bonding the rest of the LED chip 100 to the substrate 120. After the testing, the optical device may determine whether the LED chip 100 satisfies a set of criteria representing a threshold operability of the LED chip 100. For example, the criteria may require that at least a threshold number of LEDs 103 on the LED chip 100 are operational, no two LEDs 103 within a threshold distance of each other are not operational, no LED 103 is always on, and the like. If the LED chip 100 does not satisfy the set of criteria, the LED chip 100 may be discarded before being bonded to the substrate. If the LED chip 100 does satisfy the set of criteria representing the threshold operability of the LED chip 100, the active electrodes 115 may be bonded to the contacts 132 on the substrate 120. In some embodiments, the active electrodes 115 may be exposed to the laser beam 212 at corners or edges of the active electrodes 115 outside of the emission area 125. Laser beam 212 exposure to the emission area 125 can lead to lower efficiency or other degradation in the function of the LEDs 103, and by applying the laser beam 212 to the corners or edges outside the emission area 125, this problem can be mitigated. Because the dummy electrodes 101C are already fixed to the substrate 120 and keep the LED chip 100 properly aligned, misalignment between the active electrodes 115 and the contacts 132 due to the difference in the coefficient of thermal expansion (CTE) between the LCD chip 100 the substrate may be avoided while the active electrodes 115 are being bonded to the substrate 120 using the laser beam 212.

In some embodiments, during final stages of manufacturing, the dummy electrodes 101C may be removed from the LED chip 100. After the active electrodes 115 are bonded to contacts 132 on the substrate 120, the dummy electrodes 101C may no longer be needed for holding the LED chip 100 in place. The dummy electrodes 101C may be placed along the dicing street to be removed during die preparation when the LED chip 100 is singulated. In other embodiments, the dummy electrodes 101C may be left on the LED chip 100 to improve a bonding force between the LED chip 100 and the substrate 120.

Figure 3:
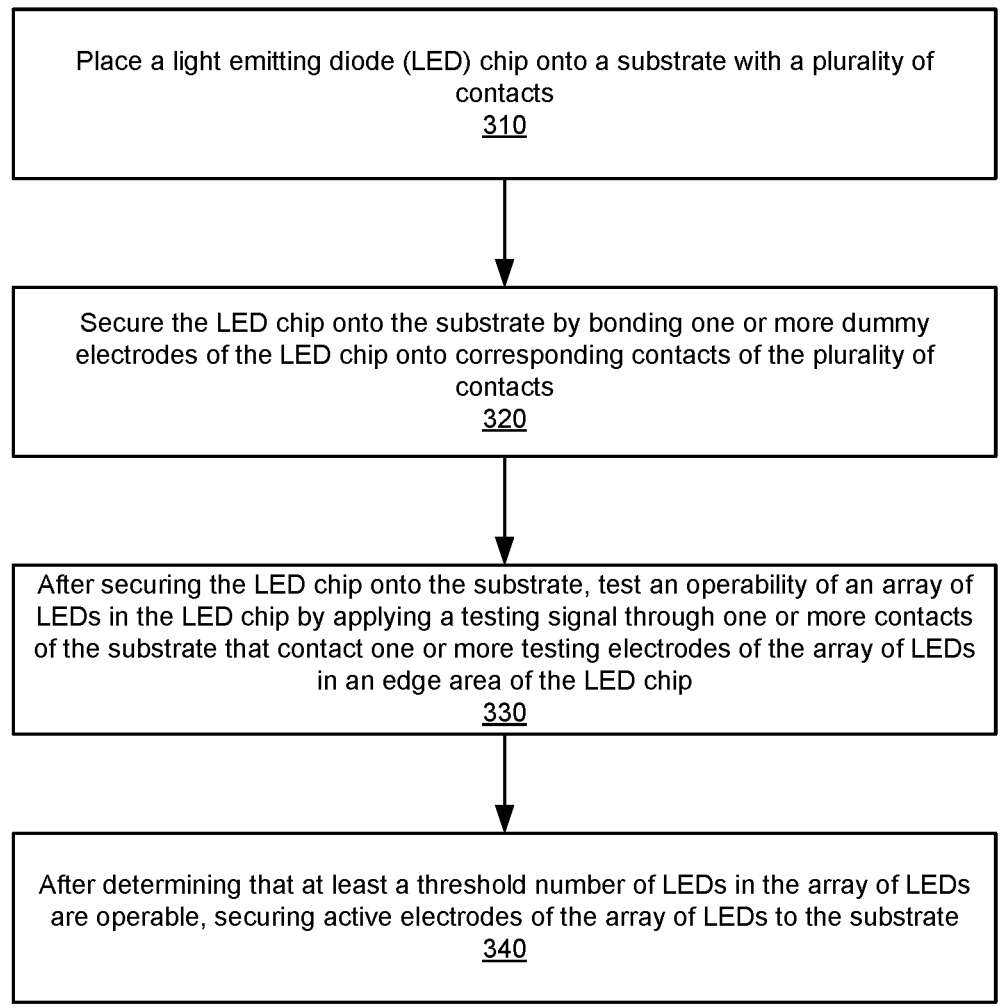
FIG. 3 is a flowchart depicting a process of bonding dummy electrodes of an LED chip onto a substrate, in accordance with an embodiment.

FIG. 3 is a flowchart depicting a process of bonding dummy electrodes of an LED chip onto a substrate, in accordance with an embodiment. A light emitting diode (LED) chip is placed 310 onto a substrate with a plurality of contacts. The LED chip has a display area and an edge area. The display area may include an array of LEDs for emitting light, and the edge area may include common electrodes, testing electrodes, and dummy electrodes.

The LED chip is secured 320 onto the substrate by bonding one or more dummy electrodes of the LED chip onto corresponding contacts of the plurality of contacts. The one or more dummy electrodes may be exposed to a laser beam that causes the one or more dummy electrodes to bond with the corresponding contacts. The one or more dummy electrodes are used for providing extra bonding strength between the LED chip and the substrate and do not carry any signals or current to the array of LEDs.

After securing the LED chip onto the substrate, an operability of the array of LEDs in the LED chip is tested 330 by applying a testing signal through one or more contacts of the substrate that contact one or more testing electrodes of the array of LEDs in an edge area of the LED chip. The array of LEDs may be determined as operable if at least a threshold number of LEDs in the array of LEDs are operable.

After determining that at least the threshold number of LEDs are operable, active electrodes of the array of LEDs are secured 340 to the substrate. The active electrodes may be exposed to the laser beam at corners or edges of the active electrodes away from emission areas of the LEDs.

Figure 4:
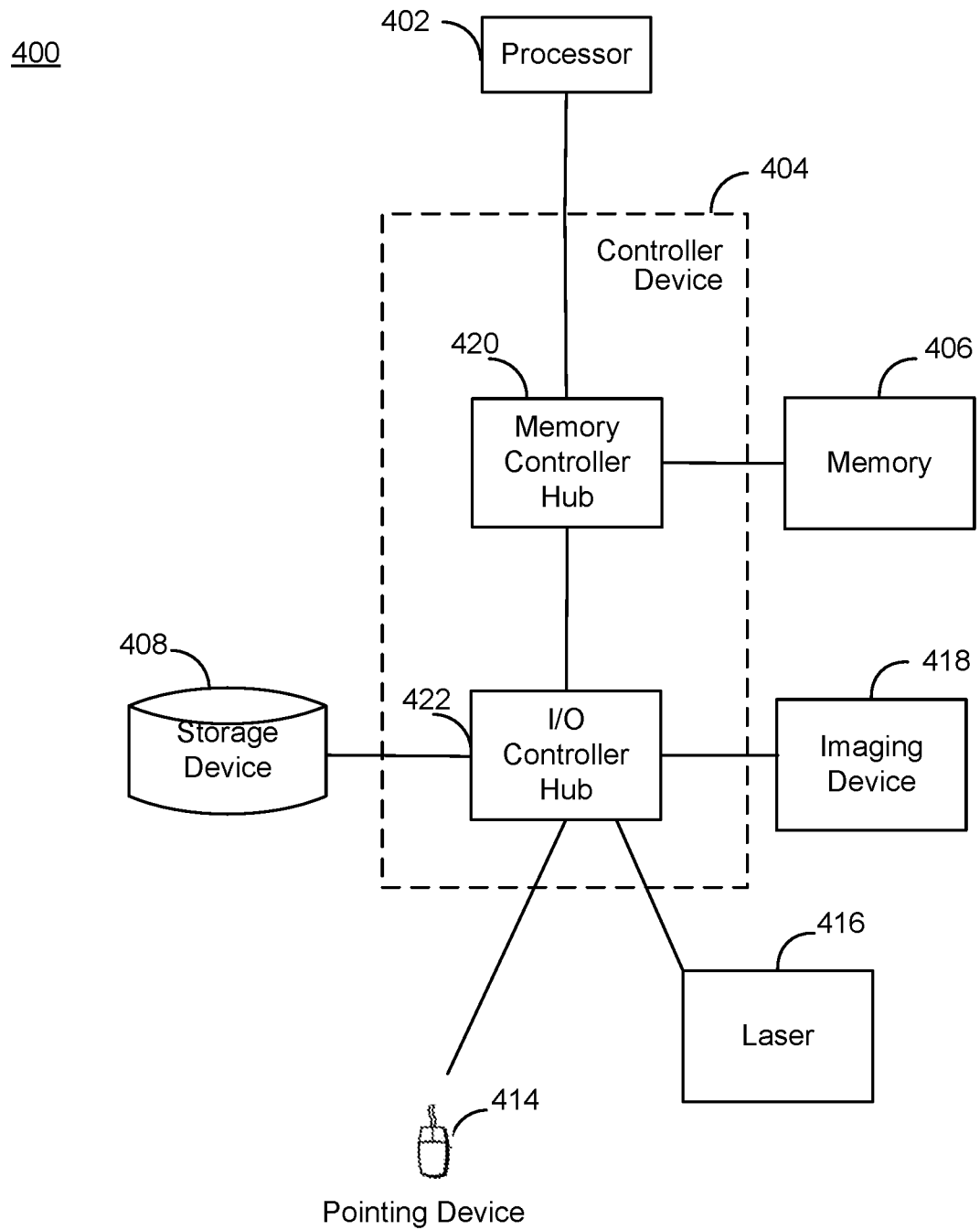
FIG. 4 is a block diagram illustrating a computing system for use in the bonding system of FIG. 2, in accordance with an embodiment.

FIG. 4 is a block diagram illustrating a computing system for use in the bonding system of FIG. 2, in accordance with an embodiment. The computer system 400 may be used to control the testing processes or manufacturing processes discussed herein. For example, the process 300 shown in FIG. 3 may be performed under the control of the computing system 400. Illustrated in FIG. 5 are at least one processor 402 coupled to a controller device 404. The controller device 404 includes a memory controller hub 420 and an input/output (I/O) controller hub 422. A memory 406 is coupled to the memory controller hub 420. A storage device 408, a pointing device 414, a laser 416, and an imaging device 418 are coupled to the I/O controller hub 422. Other embodiments of the computer system 400 have different architectures. For example, the memory 406 is directly coupled to the processor 402 in some embodiments.

The storage device 408 includes one or more non-transitory computer-readable storage media such as a hard drive, compact disk read-only memory (CD-ROM), DVD, or a solid-state memory device. The memory 406 holds instructions and data used by the processor 402. For example, the memory 406 may store instructions that when executed by the processor 402, configures the processor to perform the process 300. The pointing device 414 is to input data into the computer system 400. Some embodiments of the computer system 400 have different and/or other components than those shown in FIG. 4.

The I/O controller hub 422 may control trajectory of laser beams emitted by the laser 416 based in part on images captured by the imaging device 418. The imaging device 418 may capture images of an LED chip during testing to determine which LEDs on the LED chip are operational. Based on the captured images, the processor 402 may determine positions on the LED chip to expose to the laser beams for bonding. The imaging device 418 may also be used to align the laser beams to the determined positions during manufacturing stages for bonding the LED chip to a substrate or a different chip and to identify positions of dummy electrodes on the LED chip. The I/O controller hub 422 may also control a position and intensity of the laser 416 when securing the LED chip.

The computer system 400 is adapted to execute computer program modules for providing functionality described herein. As used herein, the term "module" refers to computer program instructions and/or other logic used to provide the specified functionality. Thus, a module can be implemented in hardware, firmware, and/or software. In one embodiment, program modules formed of executable computer program instructions are stored on the storage device 408, loaded into the memory 406, and executed by the processor 402. For example, program instructions for the method describe herein can be stored on the storage device 408, loaded into the memory 406, and executed by the processor 402.

Although the above embodiments are described primarily with respect to bonding the LED chip to a substrate, the same method of bonding may be used to bond the LED chip to a different chip, bonding a different type of chip onto another chip, or bonding a chip onto a wafer. Furthermore, the same method may be used to bond a wafer with light emitting elements onto another wafer.

The language used in the specification has been principally selected for readability and instructional purposes, and it may not have been selected to delineate or circumscribe the patent rights. It is therefore intended that the scope of the patent rights be limited not by this detailed description, but rather by any claims that issue on an application based hereon. Accordingly, the disclosure of the embodiments is intended to be illustrative, but not limiting, of the scope of the patent rights, which is set forth in the following claims.

What is claimed is:

1. A light emitting diode (LED) assembly comprising:
a substrate having a surface with a plurality of contacts; and
an LED chip attached to the surface of the substrate, the LED chip comprising:
an array of LEDs in a display area, electrodes of the array of LEDs bonded to a subset of the plurality of contacts of the substrate to receive electrical signals, and
at least one dummy electrode in an edge area surrounding the display area for securely attaching the LED chip to the substrate, the at least one dummy electrode bonded to at least one contact of the plurality of contacts without conducting electrical signals from the substrate.

2. The LED assembly of claim 1, wherein the at least one dummy electrode is laser bonded with the at least one contact on the substrate.

3. The LED of claim 1, wherein one or more dummy electrodes are on each edge of the edge area.

4. The LED assembly of claim 1, wherein each LED of the array of LEDs is configured to emit light of a same color.

5. The LED assembly of claim 1, wherein the LED chip further comprises at least one testing electrode in the edge area for testing operability of at least a subset of the array of LEDs.

6. The LED assembly of claim 5, wherein the at least one testing electrode is disposed at a corner of the LED chip where two edges of the edge area intersect.

7. The LED assembly of claim 1, wherein the LED chip further comprises at least one common electrode in the edge area for operating a plurality of the LEDs in the array of LEDs.

8. The LED assembly of claim 1, wherein the LED chip further comprises at least one active electrode in the display area, the at least one active electrode configured to bond with at least one contact of the plurality of contacts on the substrate.

9. The LED assembly of claim 8, wherein the at least one active electrode is configured to supply an electrical signal to at least one LED of the array of LEDs for emitting light.

10. The LED assembly of claim 8, wherein the at least one active electrode is bonded with the at least one contact of the plurality of contacts at edges or corners of the at least one active electrode.

* * * * *

UNITED STATES PATENT AND TRADEMARK OFFICE
CERTIFICATE OF CORRECTION

| | | |
|---|---|---|
| PATENT NO. | : 11,276,672 B1 | |
| APPLICATION NO. | : 16/596527 | |
| DATED | : March 15, 2022 | |
| INVENTOR(S) | : Jeb Wu | |

It is certified that error appears in the above-identified patent and that said Letters Patent is hereby corrected as shown below:

In the Claims

In Column 10, Claim 3, Line 4, delete "The LED of claim 1," and insert -- The LED assembly of claim 1, --.

Signed and Sealed this
Ninth Day of August, 2022

Katherine Kelly Vidal
*Director of the United States Patent and Trademark Office*